United States Patent [19]

Gindrup et al.

[11] Patent Number: 4,624,798

[45] Date of Patent: Nov. 25, 1986

[54] ELECTRICALLY CONDUCTIVE MAGNETIC MICROBALLOONS AND COMPOSITIONS INCORPORATING SAME

[75] Inventors: Wayne L. Gindrup, Hickory; Rebecca R. Vinson, Conover, both of N.C.

[73] Assignee: Carolina Solvents, Inc., Hickory, N.C.

[21] Appl. No.: 702,684

[22] Filed: Feb. 19, 1985

Related U.S. Application Data

[63] Continuation-in-part of Ser. No. 612,622, May 21, 1984.

[51] Int. Cl.$^4$ .................... H01F 1/00; H01F 1/26; C04B 35/04; H01B 1/06
[52] U.S. Cl. ................... 252/62.54; 252/62.55; 252/511; 252/513; 428/403; 428/406; 428/407; 523/218
[58] Field of Search ............... 428/403, 407, 406; 523/218; 252/514, 62.55, 513, 511, 62.54

[56] References Cited

U.S. PATENT DOCUMENTS

| | | | |
|---|---|---|---|
| 2,871,139 | 1/1959 | Wein | 117/35 |
| 3,476,530 | 11/1969 | Ehrreich et al. | 29/192 |
| 3,635,824 | 1/1972 | Brandes et al. | 252/512 |
| 3,846,345 | 11/1974 | Mason et al. | 252/514 |
| 3,877,960 | 4/1975 | Knoss | 427/217 |
| 3,988,651 | 10/1976 | Hertz | 317/258 |
| 4,199,614 | 4/1980 | Ziolo | 428/406 |
| 4,218,430 | 8/1980 | Biggerstaff | 264/15 |
| 4,316,786 | 2/1982 | Vu et al. | 204/223 |
| 4,415,512 | 11/1983 | Torobin | 264/13 |
| 4,419,279 | 12/1983 | Abrams | 252/514 |
| 4,434,541 | 3/1984 | Powers, Jr. | 29/600 |
| 4,496,475 | 1/1985 | Abrams | 252/512 |
| 4,496,627 | 1/1985 | Azuma et al. | 428/407 |

FOREIGN PATENT DOCUMENTS

| | | |
|---|---|---|
| 36940 | 10/1981 | European Pat. Off. . |
| 3210770 | 9/1983 | Fed. Rep. of Germany . |
| 94106 | 11/1972 | German Democratic Rep. . |
| 542909 | 11/1973 | Switzerland . |

OTHER PUBLICATIONS

"Effects of Particle Type on the Conductivity of Silvered Glass in Reinforced Composites" by Richard E. Heinze and James R. Ritter.
Annual Technical Conference 1977–Reinforced Plastics/Composites Institute–The Society of Plastics Industry Inc.–Section 8-D, pp. 1-3.

*Primary Examiner*—Herbert J. Lilling
*Attorney, Agent, or Firm*—Bell, Seltzer, Park & Gibson

[57] ABSTRACT

Electrically conductive microparticles characterized by high conductivity and low density are comprised of electrically nonconductive magnetic microballoons having an electrically conductive coating of a metal. When dispersed in an electrically nonconductive matrix, an electrically conductive composite material is formed in which the microparticles form a network of contacting particles throughout the matrix.

11 Claims, No Drawings

ELECTRICALLY CONDUCTIVE MAGNETIC MICROBALLOONS AND COMPOSITIONS INCORPORATING SAME

CROSS REFERENCE TO RELATED APPLICATIONS

This application is a continuation-in-part of commonly-owned copending application Ser. No. 612,622, filed May 21, 1984.

BACKGROUND OF THE INVENTION

The present invention relates to conductive magnetic microparticles, their formation, and their use in a matrix of electrically nonconductive materials to produce an electrically conductive composite.

It is known that the inclusion of conductive metal particles in a matrix of electrically nonconductive material will produce a composite which is electrically conductive. Such composites rely upon particle-to-particle contact to produce a network of particles through which electrical current may flow. Typical composites rely upon particles of metals such as copper, tin, silver, gold, platinum, stainless steel, nickel, and various alloys thereof, or other conductive materials such as carbon or carbon fibers. These conductive particles have been mixed into polymers such as acrylics, phenolics, alkyds, rubbers, silicones, vinyls, urethanes, and other electrically nonconductive materials.

However, these composites suffer from one or more of the following detrimental characteristics: (1) In materials utilizing metals as the conductive component, the metal particles are very dense compared to the polymer matrix and thus tend to settle and separate from one another both before and during usage. (1) In materials utilizing carbon as the conductive component, the amount of carbon required to produce desirable conductivity causes the resulting composite to lose desirable mechanical properties. (3) In compositions which do achieve good conductivity the quantity of particles that must be incorporated make them very heavy.

It has also been proposed to use silver coated particles, such as silver coated glass fibers, glass flakes, solid glass spheres, and hollow glass spheres, in resin composites to render the composites electrically conductive. Heinze and Ritter, "Effects of Particle Type on the Conductivity of Silvered Glass in Reinforced Composites", Annual Technical Conference, 1977 Reinforced Plastics/Composites Institute, The Society of the Plastics Industry, Inc. However, these composites were reported to suffer many of the same problems noted above. The heavy silver coated solid glass particles tend to settle and give inconsistent electrical conductivity properties throughout the composite. The lighter silver coated hollow glass spheres were reported to require a high percentage (25% by weight) silver and to produce significant strength loss in the composite. The hollow glass spheres are quite fragile and are easily broken during processing. Additionally, difficulties have been encountered in obtaining a uniform coating with good adherence. Furthermore, the hollow glass spheres are relatively costly, and this, coupled with the high percentage silver required, limits their usefulness for many applications.

SUMMARY OF THE INVENTION

The present invention provides an electrically conductive microparticle which can be incorporated into plastics and other electrically nonconductive materials and which is characterized by superior long-term electrical conductivity, low density, and lower cost. The microparticle comprises a microballoon having magnetic properties and a coating of electrically conductive material on its surface.

The present invention further provides an electrically conductive composite material comprising a contacting network of the coated electrically conductive magnetic microballoons of the invention disposed in an electrically nonconductive matrix, which composite material is characterized by low density, structural integrity, and excellent conductivity due to the magnetic properties of the microballoons. Such composites have a variety of useful applications, a number of which will be described herein.

It has been found in accordance with the present invention that electrically nonconductive magnetic microballoons may be coated with an extremely thin layer of metal to produce a material which can be incorporated into electrically nonconductive materials to give composites with superior electrical conductivity. These composites have a very low density, often lower than the electrically nonconductive plastic. Additionally, the desirable mechanical properties of the composite are only slightly affected by the inclusion of metal coated magnetic microballoons.

DETAILED DESCRIPTION

The term "microballoons" is understood by persons skilled in the art as referring to minute low density particles in the form of hollow or porous spheres formed of plastic, glass or ceramic. They are most commonly used as fillers in solid materials such as resins to form low density high strength composite materials. The preferred microballoons for use in the present invention have a specific gravity on the order of 0.2 to 2 and a particle size ranging from one micron to a maximum of about 500 microns. A particularly suitable microballoon has a specific gravity on the order of about 0.7.

Of special importance to the present invention is that the microballoons have magnetic properties. It has been found in the present invention that certain grades of commercially available ceramic microballoons have inherent magnetic properties. The magnetic properties are attributable to the presence in the ceramic composition of magnetic components such as iron, nickel, iron oxide, ferrite or mixtures of these materials. This magnetic property enhances the tendency of the metal coated microballoons to form networks, and gives composites with exceptional electrical conductivity. The commercially available magnetic ceramic microballoons are presently the preferred type of magnetic microballoon for use in the present invention due to their low cost, high strength, and good plating properties. However, the present invention may also use magnetic microballoons formed from other materials, such as plastic and glass for example.

Examples of commercially available ceramic microballoons having magnetic properties include Q-Cell Grades 100, 110, 120, from The PQ Corporation, Valley Forge, Pa.; and Extendospheres XOL-200, CG, SG, SF-14, and others from PA Industries, Chattanooga, Tenn. These are lightweight, strong microspheres formed of a ceramic composition composed primarily of aluminum silicates, magnesium silicates, sodium silicates, or mixtures of these materials. The microspheres have a hollow, porous ceramic shell, and are considerably stronger and more abrasion resistant than siliceous (glass) hollow microspheres. More particularly, these ceramic microspheres, which are referred to as "centospheres" are derived from the ash from industrial furnaces which burn powdered coal, and certain grades of them are magnetic as a consequence of the coal containing magnetic impurities such as iron, ferrite, nickel, ferric oxide and magnetite. Since they are a byproduct of coal-fired furnaces, they are considerably less expensive than commercially manufactured microballoons.

The coal-produced centospheres are not all equally magnetic, but in order to be useful in the present invention it is not necessary that every particle in the composite have magnetic properties since non-magnetic particles may be trapped into the conductive chains or networks created by the magnetic particles.

For many applications it may be desirable to refine or enhance the magnetic properties of the commercially available microballoons. The more magnetic particles may be separated with a magnet from the less magnetic particles. By metal coating these more magnetic particles as described elsewhere herein and using these select, highly magnetic coated particles in a composite, a most superior product is produced. We have also found that the permanent magnetic domains in the commercially available magnetic centospheres are in general, randomly oriented. By heating the spheres slowly to avoid breakage to a point above the Curie Point, and then allowing the particles to cool in a strong magnetic field, a strong permanent magnetic field orientation of the domains is achieved and magnetic linking of the particles is further enhanced.

The magnetic properties which have been discovered in certain of the microballoons prior to metal coating, when combined with the metal plating of the present invention, give a particle with a greatly enhanced capability for forming a conductive composite with a suitable matrix. Specifically, because of the magnetic properties, the microballoons have a greater tendency to form networks among themselves than would be the case were they not magnetic. Consequently, when added to a matrix such as a polymer, the microballoons are magnetically attracted towards one another and form networks much more favorably than would most other particles. In this regard, it will be noted that the low density of the metal coated microballoons serves to enhance the networking effect of the magnetic properties.

The metal coated microballoons of the present invention are advantageous in several respects. First, because of their light weight, they may be included in a composite material without significantly adding to its weight, and indeed in some cases, may actually serve to advantageously reduce the density of the composite to a density less than the matrix from which the composite is made. Thus, the metal coated microballoons suffer none of the disadvantages of excess weight that exist where metal particles are used in such a matrix, and are also considerably less costly.

Second, the structural integrity and low density of the metal coated microballoons enables them to exhibit inherently good mechanical properties, both by themselves and when included in a composite material as described herein.

Some metals are more effective than others in providing long-term conductivity when incorporated into the present invention. For example, copper, when freshly cleaned and incorporated into a polymer, gives good electrical conductivity at first, but which slowly diminishes with aging as the copper oxidizes at the particle-to-particle contact points. Alternatively, noble metals such as silver, gold, platinum, and palladium give the best results, having a negligible tendency to oxidize at the contact points. A composite loaded with sufficient noble metal particles to produce electrical conductivity is very expensive, very heavy, and causes problems in that the metal tends to settle and separate from the plastic. However, by providing a thin coating of the noble metal on the surface of an inexpensive and lightweight magnetic microballoon, it is possible to achieve the desirable electrical properties of the metal while avoiding the above noted problems.

In the preferred embodiment of the invention, the microballoons are coated with silver. Silver is advantageous in two respects: the basic chemistry for depositing a coating of silver is well known; and silver is presently the least expensive of the noble metals.

In developing a practical method to silverplate microballoons, however, it has been found that concentrations and techniques must be drastically changed from the normal plating methods. In contrast to the face of a sheet of glass, microballoons present an extremely large surface area to a silverplating solution. In the present invention, it has been found that the use of typical or known formulas for silvering mirrors are inapplicable and unsuitable to the silvering of microballoons. Typically, when used to attempt to plate microballoons, these formulas result in large amounts of precipitated colloidal silver, evidenced by a very dark black plating solution and very poor surface appearance of the microballoons.

The present invention includes a procedure that yields bright, extremely thin coatings of silver upon the surface of the microballoons. This procedure allows for the control of the thickness of the deposited metal and an essentially complete usage of the silver contained in solution. The prior art, as exemplified by U.S. Pat. No. 2,871,139, teaches the use of various metal hydroxides, carbonates, or bicarbonates to raise the pH of the silvering solution and, in general, teaches that higher pH's result in faster silvering. Powerful materials such as hydrazine sulfate are used for reducing agents. Such processes give very rapid silverplating when applied to most substrates, but not when applied to microballoons with the high surface area which they present to a plating solution.

In contrast to the prior art, it has been found in accordance with the present invention that the best results are obtained if the rate of silvering is reduced considerably. It has also been found that metal hydroxides, carbonates, or bicarbonates are detrimental to the silverplating of microballoons. Further, powerful reducing agents such as hydrazine sulfate are also detrimental. Instead, it has been found in accordance with the present invention that the best results occur when the concentration of silver nitrate is much higher than taught in the prior art, when the reducing agent is a sugar such as fructose or dextrose, and when a chelating agent is used in an amount slightly more than is otherwise required to give a clear solution when added to a silver nitrate solution.

For best results, it is desirable to carry out the metal plating in a two-step operation in which the surface of the microballoons is first sensitized by treatment with a salt of a metal selected from the group consisting of tin, platinum or palladium, followed by chemically reducing salts of metals selected from the group consisting of silver, copper, nickel, gold, platinum, palladium, osmium, iridium, tin or their mixtures using a mild reducing agent such as a reducing sugar (e.g. fructose or dextrose).

PREPARATION OF METAL COATED MICROBALLONS

The following examples illustrate typical methods of forming the metal-plated microballoons according to the present invention.

EXAMPLE #1

40 grams of Q-Cel 120 microballoons obtained from the PQ Corporation were placed in a 1 liter separatory funnel with 500 milliliters water and a solution of 3 grams of stannous chloride and 3 milliliters of concentrated hydrochloric acid in 100 milliliters water was added. This mixture was shaken and those beads which settled were removed. The remaining microballoons were washed with 800 ml. tap water three times and with 200 ml. distilled water twice. The microballoons were then washed with acetone, gravity filtered, and air dried at 60° C.

50 ml. of a 2% fructose solution was added to 1.4 grams of the above dry microballoons in a 300 ml. polyethylene jar. A second solution was prepared by taking 50 ml. of 2% silver nitrate and adding 50% by weight aqueous AMP-95 (2-amino-2-methyl-1-propanol from International Minerals and Chemical Corp.) until the solution just cleared, and then adding a few extra drops of AMP-95. This solution was added to the 300 ml. polyethylene jar and the mix was tumbled for 45 minutes. The microballoons were gravity filtered, washed with tap water and air dried. Bright uniformly coated spheres were produced.

Because Q-Cel 120, when added to water, gives an alkaline solution with a pH of 10, addition of stannous chloride without additional hydrochloric acid would cause stannous hydroxide to precipitate and give a useless product for silvering.

EXAMPLE #2

80 grams of Q-Cel 110 from the PQ Corporation were placed in a 1 liter separatory funnel with 500 ml. tap water, shaken, and those microballoons settling were removed. To this mixture was added a solution of 4 grams stannous chloride and 5 ml. concentrated hydrochloric acid in 100 ml. water. This mix was shaken for 5 minutes and any microballoons settling were again removed. The microballoons were washed in the separatory funnel twice with 500 ml. tap water and twice with 200 ml. distilled water. This product was then air dried.

50 grams of the resulting tinned microballoons were placed in a 550 ml. polyethylene jar. 200 ml. of a 2% fructose solution were added, and this mixture was tumbled. For the plating, 6 grams of silver nitrate were dissolved in 150 ml. distilled water and 16 ml. of 50% by weight AMP-95 was added to give a clear solution. This silver nitrate solution was added to the polyethylene jar and the mix was tumbled for 45 minutes. The microballoons were then vacuum filtered, washed with 500 ml. tap water, rinsed with tap water, acetone, and air dried. The yield was essentially quantative. Examination of the balloons with a microscope showed each uniformly covered with a bright mirror-like silver coating.

EXAMPLE #3

Tin-sensitized Q-Cel 110 as prepared in Example 2 may be silverplated at various silver ratios. Typically the weight of Q-110 could be 5, 10, 20, 25, or 30 grams treated with 3 grams silver nitrate by the following procedure. The Q-110 is placed in a 300 ml. polyethylene jar and 100 ml. of 2% fructose is added. This mix is tumbled while a solution is prepared from 3 grams of silver nitrate dissolved in 100 ml. distilled water and 7.5 ml. of 50% by weight aqueous AMP-95. A few extra drops of the AMP-95 solution are added. The tumbler is stopped while the silver nitrate solution is being added. Tumbling is continued for 45 minutes. These microballoons may be gravity or vacuum filtered, washed, and air dried. This procedure gives excellent results, producing silver coated microballoons having loadings of silver ranging from approximately 28% silver to 6.25% silver. All spheres have a bright shiny appearance.

EXAMPLE #4

500 grams of Q-Cel 110 were placed into a 2 gallon stainless steel container. A solution was prepared of 5 grams of stannous chloride and 5 ml. concentrated hydrochloric acid in 500 ml. tap water. This solution was added to the microballoons and stirred for 5 minutes. Approximately 2 liters of tap water were then added and the mix was stirred and then allowed to sit for about 10 minutes. The microballoons which floated (approximately 96%) were then removed and vacuum filtered. The microballoons were then washed with 2 liters tap water followed by 600 ml. of distilled water. The damp, tin-sensitized microballoons were placed in a lined gallon can along with 65 grams of dextrose in 1300 ml. of distilled water. 64 grams of silver nitrate were then dissolved in 700 ml. distilled water. 82 ml. AMP-95 (as received from the distributor) was added to the silver nitrate solution, producing a clear solution. This solution was added to the gallon can which was then sealed and tumbled for 4 hours. After tumbling, the microballoons were vacuum filtered and washed with tap water. Following an acetone rinse, the bright, shiny silver coated microballoons were air dried. This procedure yielded approximately 480 grams of product.

EXAMPLE #5

500 grams of centospheres, grade CG, obtained from PA Industries were slurried in water and a powerful permanent magnet was suspended in the mixture. After a minute, the magnet was removed, rinsed lightly with water, and the attracted material was mechanically removed. This process was repeated until 40 grams of material had been collected. This material was then slurried with water in a small separatory funnel to allow separation of the magnetic microballoons from magnetic dross. The highly magnetic microballoons were silvered as described in Example 1, and were thereafter incorporated in an epoxy resin to produce a composite with greatly enhanced electrical conductivity.

EXAMPLE #6

20 grams of centospheres which had been magnetically separated as described in Example #5 were slowly heated in a porcelain crucible to approximately 550° C. The crucible was then allowed to slowly cool between the poles of a powerful permanent magnet. The particles were silvered as described in Example #1 as exhibited improved electrical conductivity attributable to the enhanced magnetic attraction between the particles.

EXAMPLE #7

A coating composition was prepared by dissolving 20 grams of an acrylic resin (B48N, obtainable from Rohm & Haas) in 100 grams of methyl isobutylkeytone. To this mixture was added 20 grams of silvered magnetic ceramic microballoons as prepared in Example #1. This mix was sprayed on glass panels and allowed to dry, giving a conductance measurement of about 0.3 ohm/square.

For comparison, a duplicate sample was prepared using non-magnetic glass microballoons (Q-Cel 400 obtained from the PQ Corporation) which were silvered as described in Example #1. The sample gave a conductance measurement of about 1 ohm/square. The sample containing silvered magnetic ceramic microballons exhibited about a 300% improvement in conductivity.

Uses of Metal Coated Microballoons

According to the present invention, many significant and advantageous uses may be made of the plated magnetic microballoons, of which the following are examples not intended to limit the scope of the present invention.

The metal coated magnetic microballoons of the present invention may be incorporated into typical coating formulas to give electrically conductive coatings. These coatings may be applied by brushing, spraying, or other methods. As an example, a cellulose acetate butyrate lacquer was mixed with 20% by weight of the material as prepared in Example 4 herein and sprayed on a glass panel. After drying, measurements with an ohm meter gave readings of 6 ohms with a probe spread of 8 inches or about 4 ohms with a probe spread of 4 inches. This coating was an effective radio frequency shield.

The metal plated magnetic microballoons may also be used to produce an electrically conductive adhesive when they are incorporated into an adhesive composition. As an example, a commercially available hot melt adhesive was melted and 30% by weight of the metal coated magnetic microballoons prepared in Example 4 herein were stirred in. Tin panels were joined with this hot melt at a separation of $\frac{1}{8}$ inch. When cooled, the conductivity across the adhesive joint was found to be 0.1 ohm.

The metal coated magnetic microballoons may also be used to produce an electrically conductive liquid which is suitable for the replacement of mercury in certain types of switches. A mixture of silicone oil or other electrically nonconductive liquid mixed with 30% by weight metal coated magnetic microballoons behaves as an electrically conductive liquid and will cause a low resistance electrical circuit to be formed when placed between two electrodes.

The strength of the microballoons is sufficient to allow for injection molding and extrusion. If sufficient metal coated magnetic microballoons are used, injection molded or extruded parts are highly electrically conductive.

In other applications, the metal coated magnetic microballoons of the present invention may be sprayed to a tacky surface of paint, polymer or other similar materials to produce an electrically conductive surface.

The metal coated magnetic microballoons of the present invention also perform well in certain applications even without being placed in a polymer matrix. For example, the equivalent of an electrically conductive wire that will not break upon repeated flexing may be prepared by tightly filling a piece of rubber tubing with the dry metal coated microballoons. This device will maintain conductivity without breaking upon repeated flexing.

Where a thin coating of catalytic metal such as platinum is applied to the magnetic microballoons, a unique catalyst may be prepared which is useful for fluidized beds, and in contrast to more dense beads, has a very low heat capacity and the pressures required to maintain the fluidized condition are extremely low. The magnetic properties occurring just below the surface of the catalytic metal and the magnetic field extending into the catalytic surface may affect the catalytic properties in a beneficial manner for some processes.

Metal coated magnetic microballoons below 50 microns in diameter may be incorporated into printing inks and pastes to produce electrically conductive printing suitable for detection by electronic means.

Electrically conductive epoxy castings and adhesives may be prepared by incorporating sufficient metal coated magnetic microballoons of the present invention. As an example, a two component epoxy system was prepared and 30% by weight of the metal coated microballoons were stirred in. The mix was placed in several polyethylene containers and allowed to harden. The resulting plastic castings exhibited very good electrical conductivity.

A very unique material may be prepared by adding a self-setting system such as an epoxy, urethane, or polyester to a large amount of metal coated magnetic microballoons. This yields a putty-like material which will soon harden to a very light matrix with excellent mechanical and electrical properties. A similar system may also be prepared by lightly wetting the spheres with a thermosetting polymer such as a phenolic and baking it. This also yields an extra light and strong electrically conductive part.

In certain applications, it is advantageous for certain injection molded parts to be surface coated with a different material after molding has been completed. This may be accomplished by first spraying the mold parts with a coating before injection molding a part. According to the present invention, the coating incorporates metal coated microballoons, a part may then be injection molded which will result in a surface of any color, texture, or strength that is electrically conductive and suitable for RF shielding.

Static electricity causes many problems in hospital operating rooms, aircraft, computer rooms, or other areas where static charges may be generated. In the past, to bleed these electrostatic charges away, plastics were produced with very high carbon contents to produce materials with sufficient conductivity to dissipate such charges. Because the percentage of carbon required was so high, the physical properties of such coatings, coverings and floorings were poor. Incorporation of electrically conductive metal coated magnetic microballoons according to the present invention, however, yields conductive materials, flooring, and upholstery which retain good physical properties and have conductivities much greater than materials loaded with carbon.

Electronic printed circuit boards utilizing high speed solid state components often suffer from unwanted coupling, cross-talk, and external RF interference. The metal coated magnetic microballoons of the present invention may be used to produce the equivalent of a form fitting ground plane which will completely shield the board from external fields and limit internal coupling. Such a plane may be prepared by first coating the finished board with a non-electrically conductive barrier coat and then completely spraying the board with a suitable coating which incorporates sufficient metal coated magnetic microballoons to become electrically conductive.

In certain applications, coatings or castings incorporating sufficient metal coated magnetic microballoons of the present invention may be used in reflectors of electromagnetic radiation. As an example, a concave dish made of plastic which is electrically nonconductive and transparent to microwaves may be used as a microwave antenna by coating the concave surface with paint containing sufficient metal coated magnetic microballoons to make the surface electrically conductive.

For other applications, a useful patching material may be prepared by adding sufficient metal coated magnetic microballoons to a silicone rubber or the like and troweling and smoothing this mix onto such substrates as the metal plates used in complex shaped radio frequency molds.

A useful shielding material suitable for shielding telephone cables and other such electronic transmission devices may be prepared by incorporating sufficient metal coated magnetic microballoons into a mastic or putty to render the mix electrically conductive.

A useful gasket for radio frequency shielding in cable couplings may be made by incorporating sufficient metal coated magnetic microballoons to yield a conductive gasket.

A useful radio frequency shield may be prepared by incorporating sufficient metal coated magnetic microballoons in heat shrinkable tubing to produce the equivalent of a heat shrinkable metal tube.

A more uniform, reliable, and less expensive switch may be prepared by adding metal coated magnetic microballoons to a rubber, such as a silicone. In the past, pressure sensitive switches have been prepared by adding metal flakes or powder to a rubber in a concentration just below that where electrical conductivity is achieved. Upon compressing the rubber the particles touch and the composite becomes a good electrical conductor.

The metal flakes and powder used in the past tended to settle before the liquid silicone set to a rubber. The random particle shapes of the powder and flakes also caused consistent reproducibility to be difficult to achieve. Metal coated microballoons do not have any of these deficiencies. The uniform spherical shape and no tendency to settle allow the production of switches of uniform and constant electrical characteristics.

Very high static electricity charges are generated during reentry of space vehicles into the atmosphere. The metal coated magnetic microballoons of the present invention may be incorporated into the heat shields used in space vehicles to render the heat shields electrically conductive and thereby dissipate static electricity charges.

That which is claimed is:

1. Electrically conductive microparticles characterized by high conductivity and low density, said microparticles comprising hollow microballoons of a ceramic silicate composition containing magnetic impurities imparting permanent magnet properties which render the microballoons magnetically attractive to one another to form a network of contacting particles, and a plating of an electrically conductive metal uniformly covering the surface of said microballoons and imparting electrically conductive properties thereto.

2. Electrically conductive microparticles according to claim 1 wherein said microballoons have a diameter of from 1 to 500 microns and a specific gravity of 0.2 to 2.

3. Electrically conductive microparticles characterized by high conductivity and low density, said microparticles comprising hollow ceramic magnetic centospheres derived from the ash from coal-fired furnaces and having permanent magnet properties which render the microballoons magnetically attractive to one another to form a network of contacting particles, and a plating of an electrically conductive metal uniformly covering the surface of said microballoons and imparting electrically conductive properties thereto.

4. Electrically conductive microparticles characterized by high conductivity and low density, said microparticles comprising hollow microballoons formed of a ceramic silicate composition and having permanent magnet properties which render the microballoons magnetically attractive to one another to form a network of contacting particles, said microballoons having a diameter of between about 1 and 500 microns and a specific gravity of between about 0.2 and 2; and an electrically conductive coating of metal uniformly covering the surface of said microballoons and imparting electrical conductivity thereto, said metal being chosen from the group consisting of silver, copper, nickel, gold, platinum, palladium, osmium, iridium, and tin and alloys consisting essentially of these metals.

5. Electrically conductive microparticles according to claim 4 wherein said ceramic silicate composition additionally includes a magnetic material selected from the group consisting of iron, nickel, iron oxide, ferrite, or mixtures of these materials imparting magnetic properties to the microballoons.

6. Electrically conductive microparticles characterized by high conductivity and low density, said microparticles comprising hollow ceramic magnetic microballoons derived from the ash from coal-fired furnaces, said microballoons having permanent magnet properties which render the microballoons magnetically attractive to one another to form a network of contacting particles, and said microballoons having a diameter of from 1 to 500 microns and a specific gravity of between about 0.2 and 2, and a bright mirror-like silver plating uniformly covering the surface of said microballoons and imparting electrical conductivity thereto.

7. The invention according to claim 6 wherein said electrically conductive microparticles are dispersed in an electrically non-conductive matrix and are magnetically attracted to one another to form an electrically conductive network.

8. The invention according to claim 1 or 6 wherein said electrically conductive microparticles are adhered to an electrically non-conductive base and are magnetically attracted to one another to form an electrically conductive network.

9. The invention according to claim 1 or 6 wherein said electrically conductive microparticles are dispersed in an electrically non-conductive polymeric adhesive and are magnetically attracted to one another to form an electrically conductive network.

10. The invention according to claim 1 or 6 wherein said electrically conductive microparticles are dispersed in an electrically non-conductive liquid and are magnetically attracted to one another to form an electrically conductive network.

11. The invention according to claim 1 wherein said electrically conductive microparticles are dispersed in an electrically non-conductive matrix and are magnetically attracted to one another to form an electrically conductive network.

* * * * *

UNITED STATES PATENT AND TRADEMARK OFFICE
CERTIFICATE OF CORRECTION

PATENT NO. : 4,624,798

DATED : November 25, 1986

INVENTOR(S) : Wayne L. Gindrup and Rebecca R. Vinson

It is certified that error appears in the above-identified patent and that said Letters Patent is hereby corrected as shown below:

In the specification and claims:

Each occurrence of the word "microballoon" should read -- microsphere --.

Each occurrence of the word "microballoons" should read -- microspheres --.

Signed and Sealed this

Fifteenth Day of March, 1988

Attest:

*Attesting Officer*

DONALD J. QUIGG

*Commissioner of Patents and Trademarks*